United States Patent
Inoue et al.

(10) Patent No.: US 10,773,311 B2
(45) Date of Patent: Sep. 15, 2020

(54) PHOSPHORUS-CONTAINING COPPER POWDER AND METHOD FOR PRODUCING THE SAME

(71) Applicant: DOWA ELECTRONICS MATERIALS CO., LTD., Tokyo (JP)

(72) Inventors: Kenichi Inoue, Tokyo (JP); Atsushi Ebara, Tokyo (JP); Masahiro Yoshida, Tokyo (JP); Kyoso Masuda, Tokyo (JP); Takahiro Yamada, Tokyo (JP); Shinichi Uchiyama, Tokyo (JP)

(73) Assignee: DOWA ELECTRONICS MATERIALS CO., LTD., Tokyo (JP)

(*) Notice: Subject to any disclaimer, the term of this patent is extended or adjusted under 35 U.S.C. 154(b) by 151 days.

(21) Appl. No.: 15/757,427

(22) PCT Filed: Aug. 18, 2016

(86) PCT No.: PCT/JP2016/074076
§ 371 (c)(1),
(2) Date: Mar. 5, 2018

(87) PCT Pub. No.: WO2017/038478
PCT Pub. Date: Mar. 9, 2017

(65) Prior Publication Data
US 2018/0243831 A1 Aug. 30, 2018

(30) Foreign Application Priority Data
Sep. 3, 2015 (JP) ................................. 2015-173730

(51) Int. Cl.
*B32B 5/16* (2006.01)
*B22F 9/08* (2006.01)
(Continued)

(52) U.S. Cl.
CPC ................ *B22F 9/082* (2013.01); *B22F 1/00* (2013.01); *C22C 9/00* (2013.01); *H01B 1/026* (2013.01);
(Continued)

(58) Field of Classification Search
CPC ..... B01J 37/0072; B01J 23/72; B22F 2301/10
See application file for complete search history.

(56) References Cited

U.S. PATENT DOCUMENTS

| | | |
|---|---|---|
| 5,605,585 A | 2/1997 | Yamamoto et al. |
| 2014/0203222 A1 | 7/2014 | Ito et al. |

FOREIGN PATENT DOCUMENTS

| | | | |
|---|---|---|---|
| CN | 102938040 A | 4/2012 | |
| CN | 107921532 A * | 4/2018 | ............... B22F 1/00 |

(Continued)

OTHER PUBLICATIONS

Google translation JP 2004/169081 (Year: 2004).*
(Continued)

*Primary Examiner* — Hoa (Holly) Le
(74) *Attorney, Agent, or Firm* — Greenblum & Bernstein, P.L.C.

(57) ABSTRACT

An object of the present invention is to provide a phosphorus-containing copper powder with good volume resistivity and a small carbon content by suppressing an oxygen content to a relatively low value even if a particle size is made small, and a method for producing the same. In the phosphorus-containing copper powder containing phosphorus, a ratio of an oxygen content (wt. %) to a BET specific surface area ($m^2/g$) (oxygen content/BET specific surface area) is 0.90 wt. %·$g/m^2$ or less, a divalent copper compound is present on a surface of particles constituting the phosphorus-containing copper powder, a carbon content is 0.10 wt. % or less, and D50 is 7.11 μm or less.

17 Claims, 2 Drawing Sheets

EXAMPLE 2

(51) Int. Cl.
*C22C 9/00* (2006.01)
*B22F 1/00* (2006.01)
*H01B 1/02* (2006.01)
*H01B 1/06* (2006.01)
*B22F 1/02* (2006.01)
*H01L 23/00* (2006.01)

(52) U.S. Cl.
CPC .............. *H01B 1/06* (2013.01); *B22F 1/0011* (2013.01); *B22F 1/0014* (2013.01); *B22F 1/02* (2013.01); *B22F 2009/0828* (2013.01); *B22F 2301/10* (2013.01); *B22F 2304/10* (2013.01); *H01L 24/29* (2013.01); *H01L 2224/29147* (2013.01); *H01L 2224/29187* (2013.01); *H01L 2924/01015* (2013.01)

(56) References Cited

FOREIGN PATENT DOCUMENTS

| | | | |
|---|---|---|---|
| JP | S63-100109 A | 5/1988 | |
| JP | H05-195024 A | 8/1993 | |
| JP | H07-118711 A | 5/1995 | |
| JP | 2004-169081 A | 6/2004 | |
| JP | 2005-222737 A | 8/2005 | |
| JP | 2008095169 A | * | 4/2008 |
| JP | 2009-74152 A | 4/2009 | |
| JP | 2011-6740 A | 1/2011 | |
| JP | 2014-077101 A | 5/2014 | |
| WO | WO 2011/145378 A1 | 11/2011 | |

OTHER PUBLICATIONS

Google translation JPH05195024 (Year: 1993).*
EESR for EP App. No. 16841510.7 dated Feb. 14, 2019.
International Search Report issued in PCT/JP2016/074076, dated Oct. 25, 2016.
International Preliminary Report on Patentability issued in PCT/JP2016/074076, dated Mar. 6, 2018.

* cited by examiner

COMPARATIVE EXAMPLE 1

PHOSPHORUS-CONTAINING COPPER POWDER AND METHOD FOR PRODUCING THE SAME

TECHNICAL FIELD

The present invention relates to a copper powder containing phosphorus (hereinafter referred to as a "phosphorus-containing copper powder") and a method for producing the same.

DESCRIPTION OF RELATED ART

Copper powder is used as a material of a contact member of a conductor circuit or an electrode in a paste form.

It is known that phosphorus (P) is contained in the copper powder (for example, [0015] [0016] of Patent Document 1). These paragraphs of the patent document 1 describe as follows: the reducibility of phosphorus to copper oxide is utilized, and as a result, an adhesive layer is formed, having excellent oxidation resistance, low volume resistivity, and high adhesion between a semiconductor element and a support member for mounting semiconductor element. In Patent Document 1, phosphorus-containing copper alloy particles are formed by a water atomizing method.

Incidentally, although there is no description about phosphorus-containing copper powder, a technique of forming a metal powder by the water atomizing method is also disclosed in Patent Document 2. Paragraph [0016] of Patent Document 2 describes that an aqueous solution containing an organic acid having a pH of 7 to 11 is used as a spray water in the water atomizing method.

PRIOR ART DOCUMENT

Patent Document

[Patent Document 1] Japanese Unexamined Patent Publication No. 2014-77101
[Patent Document 2] Japanese Unexamined Patent Publication No. 1993-195024

SUMMARY OF THE INVENTION

Problem to be Solved by the Invention

The inventors of the present invention investigate a decrease of a particle size of particles constituting the phosphorus-containing copper powder. At that time, the inventors of the present invention attempt to decrease a particle size by increasing a melt temperature and a spray pressure when the water atomizing method is used. However, when this method is used, it becomes clear that oxidation resistance is reduced in the copper pulverized by the spray water, and as a result, oxygen content (wt. %) of the phosphorus-containing copper powder is increased. When the oxygen content in the phosphorus-containing copper powder is increased, volume resistivity rises in a case of using the phosphorus-containing copper powder as an electric material.

In addition, it is found by the inventors of the present invention that liquid property of the spray water affects the oxygen content in a production step of the phosphorus-containing copper powder. Specifically, when the phosphorus-containing copper powder is prepared by the water atomizing method, phosphorus in the particles is eluted. It is found that at that time, when pH of the spray water is low, pH of a slurry is deviated from a passive state range of copper, corrosion of the particles is progressed, with a result that oxidation is progressed. It is also found that the specific surface area of the particles is increased as the particle size becomes smaller, and therefore the oxidation becomes more remarkable as the particle size becomes smaller.

Further, when an organic acid is used in the water atomizing method as in Patent Document 2, there is a problem that carbon content in the obtained copper powder becomes high, and the volume resistivity is increased in a conductor circuit formed by preparing the copper powder in a paste form and applying it on a substrate which is then baked. In Patent Document 2, no copper powder is produced.

An object of the present invention is to provide a phosphorus-containing copper powder with good volume resistivity and a small carbon content by suppressing an oxygen content to a relatively low value even if a particle size is made small, and a method for producing the same.

Means for Solving the Problem

As a result of examining the abovementioned problem by the inventors of the present invention, it is conceived to adopt the following constitution as a production method.

Phosphorus-containing copper powder is produced by the water atomizing method from a molten metal in which phosphorus is added to a melted copper.

The spray water used in the water atomizing method is an alkaline aqueous solution.

Patent Document 2 describes as follows: an aqueous solution having pH of 7 to 11 is used as a spray water (containing an organic acid) in the water atomizing method in order to enhance an oxidation preventing effect due to an organic acid. However, the object of the present invention is the "phosphorus-containing copper powder". Generally, it is a common knowledge for those skilled in the art that in order to eliminate an adverse effect such as resistance increase due to impurities mixed in the particles from the spray water, the spray water used in the water atomizing method is pure water.

However, the above common knowledge is overridden and the inventors of the present invention adopt the water atomizing method using an alkaline aqueous solution as the spray water in the production step of the phosphorus-containing copper powder. As a result, as shown in the following constitution, even when the particle size is reduced, it is possible to obtain the phosphorus-containing copper powder in which the oxygen content is kept relatively low and the carbon content is also kept low. Specifically, the inventors of the present invention pay attention to a point that elution of phosphorus in the particles occurs during a production step. Namely, the inventors of the present invention obtain a knowledge that not only the oxidation resistance of the phosphorus-containing copper powder itself produced after the production step, but also pH control of the spray water during production step, is focused. Therefore, there is a motivation to overturn the common knowledge, and as a result, the present invention is achieved. By controlling pH of the spray water in using phosphorus, a deoxidizing effect of phosphorus is maximized and the use of organic acid is not required. As a result, the oxygen content and the carbon content in the phosphorus-containing copper powder can be simultaneously reduced.

Based on the abovementioned knowledge, the present invention has several aspects as follows.

According to a first aspect of the present invention, there is provided a phosphorus-containing copper powder containing phosphorus, wherein a ratio of an oxygen content (wt. %) to a BET specific surface area (m$^2$/g) (oxygen content/BET specific surface area) is 0.90 wt. %·g/m$^2$ or less, a divalent copper compound is present on a surface of particles constituting the phosphorus-containing copper powder, a carbon content is 0.10 wt. % or less, and D50 is 7.11 μm or less.

According to a second aspect of the present invention, there is provided the phosphorus-containing copper powder of the first aspect, wherein a content of phosphorus is from 10 to 1000 ppm.

According to a third aspect of the present invention, there is provided the phosphorus-containing copper powder of the first aspect or the second aspect, wherein a value of oxygen in the phosphorus-containing copper powder×D50 is 1.40 wt. %·μm or less.

According to a fourth aspect of the present invention, there is provided the phosphorus-containing copper powder of any one of the first to third aspects, wherein D50 is less than 1.0 μm.

According to a fifth aspect of the present invention, there is provided the phosphorus-containing copper powder of any one of the first to fourth aspects, wherein a ratio of carbon content (wt. %) to the BET specific surface area (m$^2$/g) of the phosphorus-containing copper powder (carbon content/BET specific surface area) is 0.03 wt. %·g/m$^2$ or less.

According to a sixth aspect of the present invention, there is provided a method for producing a phosphorus-containing copper powder from a molten metal in which phosphorus has been added to melted copper by a water atomizing method, wherein a spray water used in the water atomization method is an alkaline aqueous solution.

According to a seventh aspect of the present invention, there is provided the method of the sixth aspect, wherein an amount of phosphorus to be added is such that a content of phosphorus in the molten metal is 10 to 2000 ppm.

According to an eighth aspect of the present invention, there is provided the method of the sixth or seventh aspect, wherein pH of the alkaline aqueous solution is adjusted to 8 to 12 mainly by an inorganic salt.

Advantage of the Invention

According to the present invention, a phosphorus-containing copper powder with good volume resistivity can be obtained by suppressing an oxygen content to be low even if a particle size is made small, and with less carbon content.

DETAILED DESCRIPTION OF THE INVENTION

Figure 1:
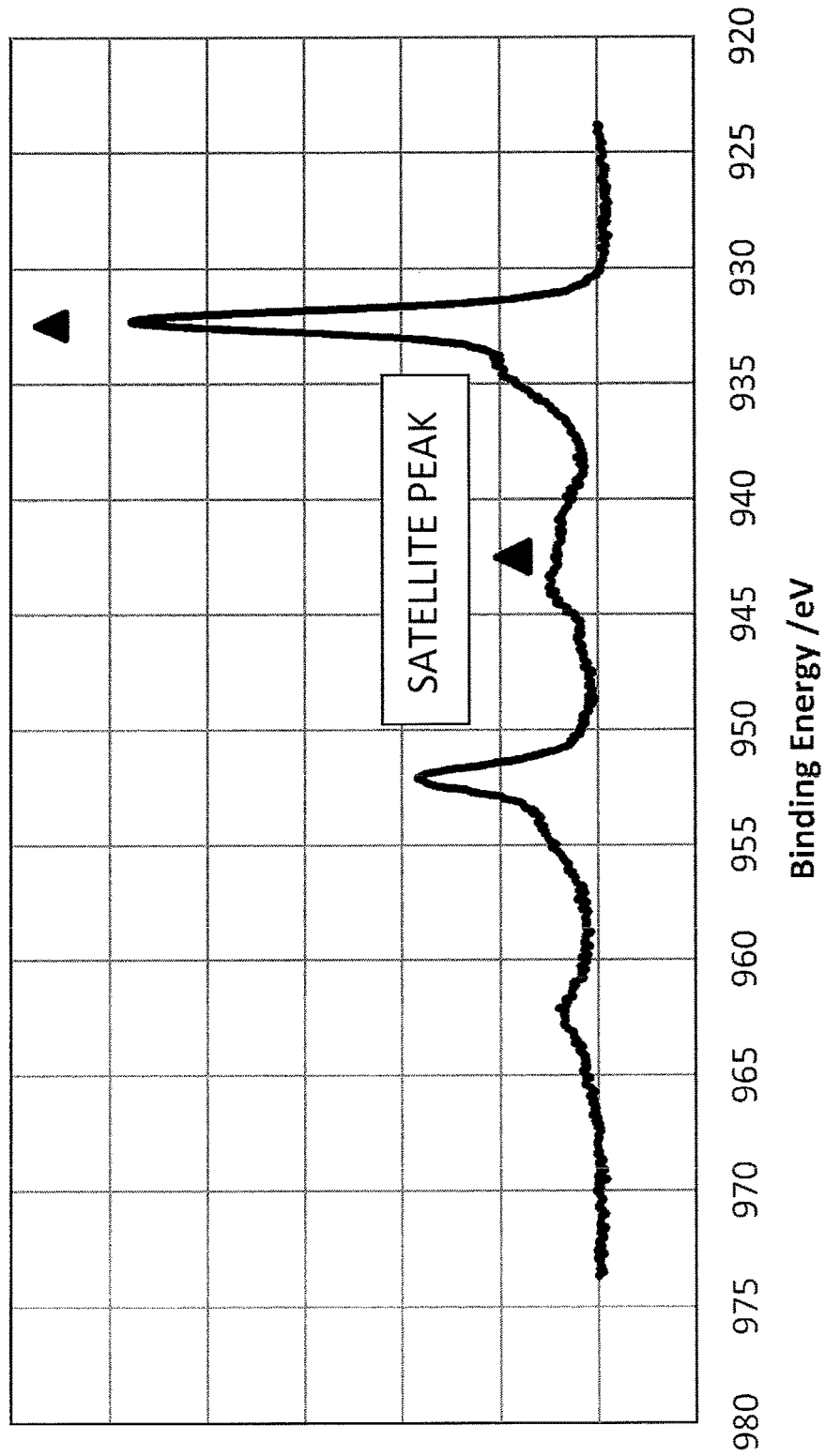
FIG. 1 is a chart showing a result of a state analysis of copper obtained by measuring a sample of example 2 by ESCA.

Embodiments of the present invention will be described hereafter in the following order.

1. Method for producing phosphorus-containing copper powder
 1-1. Copper material melting step
 1-2. Phosphorus addition step
 1-3. pH adjustment step of adjusting pH of a spray water
 1-4. Water atomization step
 1-5. Drying step and other steps
2. Phosphorus-containing copper powder
3. Effect of this embodiment In the present specification, "to" means that it is not less than a predetermined value and not more than a predetermined value.

<1. Method for Producing Phosphorus-Containing Copper Powder>

1-1. Copper Material Melting Step

In this step, a copper raw material which is a base for preparing a phosphorus-containing copper powder is melted to form a molten metal. As the copper raw material, a known material may be used, and for example, a copper alloy may be melted. As examples of elements other than copper constituting the alloy, zinc, nickel, manganese, aluminum, silver and tin can be given. The content of these elements in the copper alloy is usually 1 to 50 wt. %, and preferably 5 to 40 wt. %. Further, there are no particular restrictions on equipment and various conditions used for melting, and known equipment and conditions may be used.

1-2. Phosphorus Addition Step

In this step, phosphorus is added to the above molten metal. A method of addition is not particularly limited. For example, the phosphorus itself may be added to the molten metal, or an alloy of phosphorus and copper may be added.

An addition amount of phosphorus is preferably determined so that an content of phosphorus in the molten metal to which phosphorus has been added is 10 to 2000 ppm. Further, an amount of phosphorus contained in the phosphorus-containing copper powder is preferably 10 to 1000 ppm (more preferably 305 to 405 ppm). Even if it is out of the above range, an effect of the present invention is exhibited, but if it is 10 ppm or more, it becomes possible to sufficiently exhibit oxidation resistance by containing phosphorus, and if it is 1000 ppm or less, it is possible to effectively realize an appropriate volume resistivity when the phosphorus-containing copper powder is used as an electric material. Particularly, when an addition amount of phosphorus is set to about 1200 to 1600 ppm (the phosphorus content in the phosphorus-containing copper powder becomes about 500 to 650 ppm), the oxidation resistance of phosphorus is particularly satisfactorily exhibited, and it is possible to reduce the oxygen content and oxygen content/BET specific surface area of the phosphorus-containing copper powder, which is preferable. Further, when the addition amount of phosphorus is set to about 850 to 1200 ppm (the phosphorus content in the phosphorus-containing copper powder becomes about 380 to 550 ppm), it is also possible to reduce D50 of the obtained phosphorus-containing copper powder.

Further, a temperature of the molten metal in this step is preferably set to 1700° C. or less. By this setting, it becomes possible to effectively suppress oxidation of the phosphorus-containing copper powder. On the other hand, from a viewpoint of decreasing the particle size of the particles constituting the phosphorus-containing copper powder, the temperature of the molten metal is preferably high, and is preferably set to 1200 to 1700° C.

1-3. pH Adjustment Step of Adjusting pH of a Spray Water

In this step, pH of the spray water used in the water atomization step is adjusted. Specifically, pH is adjusted so that pH is higher than 7 using an alkaline aqueous solution as the spray water. Thus, it becomes possible to effectively provide oxidation resistance. That is, by making pH of the spray water alkaline, pH of the slurry is kept in a passive state range of copper even if phosphorus is eluted, and oxidation of the particles can be suppressed. As a result, it becomes possible to effectively reduce the oxygen content in the phosphorus-containing copper powder even when the particle size is made smaller. Thereby, in the method for producing phosphorus-containing copper powder of the present invention, it is not necessary to use an organic acid for suppressing oxidation as in Patent Document 2. Therefore, in this embodiment, the spray water substantially free of organic acid (organic acid is 1 mass % or less in the spray water) is used.

pH of the alkaline aqueous solution in this step is preferably in a range of 8 to 12 (more preferably 8 to 11, 9 to 12, and still more preferably 9 to 11). If the pH is 8 or more, it becomes possible to more effectively reduce the abovementioned oxygen content. When pH exceeds 12, the copper oxide on the surface of the copper powder is ionized and oxidation is likely to proceed. On the other hand, if pH is 12 or less, it is possible to effectively prevent the alkaline aqueous solution from affecting the phosphorus contained in the phosphorus-containing copper powder or production facilities. Further, in order to reduce D50 of the phosphorus-containing copper powder, pH of the alkaline aqueous solution is preferably set as 10 to 12.

The alkalinity of the alkaline aqueous solution used as the spray water is preferably produced mainly by an inorganic salt. Thus, the carbon content in the phosphorus-containing copper powder can be kept low, and when the phosphorus-containing copper powder is used as the conductive material, the volume resistivity can be suppressed to be low. This is a point that is greatly different from the configuration described in Patent Document 2. Caustic soda, phosphate, caustic potash, ammonia water, carbonate and the like, can be given as examples of the inorganic salt. In addition, here, the meaning " produced mainly" by inorganic salt means that the inorganic salt is more than 50 mass % among substances which become alkaline when dissolved in water. Preferably, an alkaline aqueous solution substantially free from an organic salt (having an organic salt of 1 mass % or less) is used.

1-4. Water Atomization Step

In this step, as described above, the alkaline aqueous solution (substantially free from organic acid) is adopted as the spray water, and a water atomizing method is adopted to prepare the phosphorus-containing copper powder. As for the water atomizing step, known ones may be adopted except for the conditions related to the alkaline aqueous solution and the like. For example, a high pressure water atomizing method of about 50 to 200 MPa may be adopted. When a spraying pressure is increased, D50 of the obtained phosphorus-containing copper powder can be made small.

In this step, although explanation is repeated, the inventors of the present invention overturn the common knowledge that pure water is used as the spray water in the water atomizing method in order to eliminated an adverse effect such as increase of resistance due to impurities which are derived from the spray water, and adopt the water atomizing method using the alkaline aqueous solution as the spray water, to thereby obtain the phosphorus-containing copper powder having a relatively low oxygen content even if the particle size is made small. The reason why such phosphorus-containing copper powder is obtained is that, the lowering of pH of the slurry is suppressed by using the alkaline aqueous solution as the spray water, while paying attention to the elution of the phosphorus in the particles during the production step. As a result of suppressing the lowering of pH of the slurry, corrosion of the particles is suppressed, the deoxidizing effect by phosphorus is exhibited at the maximum, and as shown in table 1 which shows results of examples described later, oxidation of the particles can be suppressed even when the particle size is made small. As a result, it becomes possible to improve the oxidation resistance of the phosphorus-containing copper powder. Further, there is no need to include the organic acid in the spray water, and therefore the carbon content in the phosphorus-containing copper powder is small and the volume resistivity is excellent.

1-5. Drying and Others

In this step, the phosphorus-containing copper particles formed by the water atomizing step are subjected to solid-liquid separation, drying, crush, and classification, to thereby obtain the phosphorus-containing copper powder. Further, each step necessary for preparing the phosphorus-containing copper powder may be performed. For example, nitrogen bubbling may be performed to the phosphorus-containing copper slurry before drying. Further, each step necessary for preparing a paste from the phosphorus-containing copper powder may also be performed. Each condition of <2. Phosphorus-containing copper powder> described later, refers to the condition after classification.

<2. Phosphorus-Containing Copper Powder>

The phosphorus-containing copper powder in this embodiment produced by the abovementioned step has the following constitution.

The ratio of oxygen content (wt. %) to BET specific surface area ($m^2/g$) (oxygen content/BET specific surface area) is 0.90 wt. %·$g/m^2$ or less.

Divalent copper compound is present on the surface of the particles constituting the phosphorus-containing copper powder.

The carbon content is 0.10 wt. % or less.

D50 is 7.11 µm or less.

First, the value of oxygen/BET specific surface area of the phosphorus-containing copper powder in this embodiment is 0.90 wt. %·$g/m^2$ or less. This means that when compared with BET, that is, the BET specific surface area of the phosphorus-containing copper powder, the oxygen content is low. The reason for placing the BET specific surface area in the denominator is as follows. When the particle size of the particles constituting the phosphorus-containing copper powder is made small, the surface area per unit mass is naturally increased and the ratio of the oxygen content attached to the particle surface is increased, and therefore if merely using the oxygen content as an indicator, it becomes difficult to distinguish whether the oxygen content is really decreased in the phosphorus-containing copper powder. Therefore, the BET specific surface area is placed in the denominator and a value indicating a balance between the specific surface area and the oxygen content is used as an index. In the phosphorus-containing copper powder of this embodiment, which is produced using the abovementioned technique, the oxygen content corresponding to the BET specific surface area is a predetermined value, that is, 0.90 wt. %·$g/m^2$ or less, preferably 0.70 wt. %·$g/m^2$ or less from a viewpoint of achieving a good volume resistivity, (Regarding the lower limit, the value of the oxygen content/BET specific surface area is usually 0.30 wt. %·$g/m^2$ or more).

In addition to the abovementioned definition, in the phosphorus-containing copper powder of this embodiment, the divalent copper compound is present on the surface of the particles constituting the phosphorus-containing copper powder. As an example of the divalent copper compound, copper (II) oxide and copper (II) carbonate can be given. Here, whether or not the divalent copper compound is present is judged based on whether or not a satellite peak (around 945 to 940 eV) of the divalent copper compound appears in X-ray photoelectron spectroscopic analysis. Specifically, when satisfying (Peak intensity of satellite peak/peak intensity of Cu2p peak)≥0.06, it is judged that the divalent copper compound is present on the particle surface. The peak intensity of the Cu2p peak mentioned here means a maximum intensity at a peak position. Also, the peak intensity of the satellite peak is the maximum intensity between 945 and 940 eV.

As described in the abovementioned technique, in this embodiment, when the phosphorus-containing copper powder is prepared, the alkaline aqueous solution is adopted as the spray water in the water atomizing method. As a result, oxidation resistance can be improved. Specifically, oxidation is suppressed on the surface of each particle constituting the produced phosphorus-containing copper powder, and even if oxidation occurs, it stably occurs and stable divalent copper compounds are generated rather than unstable monovalent copper compounds. Since the divalent copper compound is present as a very stable passivation film, it inhibits further oxidation progression. Thereby, as a result, the oxidation resistance of each particle and phosphorus-containing copper powder is improved. Namely, in the phosphorus-containing copper powder of this embodiment, the presence of the divalent copper compound on the surface of the particle means that, oxidation is effectively suppressed on the surface of each particle constituting the phosphorus-containing copper powder.

Further, as described above, in this embodiment, there is no need to use the organic acid in the water atomizing method, and therefore the carbon content in the phosphorus-containing copper powder is 0.10 wt. % or less, and the carbon content is very small. Therefore, by using the phosphorus-containing copper powder of this embodiment, a conductor having low volume resistivity can be formed. From a viewpoint of such a low volume resistivity, the carbon content in the phosphorus-containing copper powder is preferably 0.04 wt. % or less.

Further, in addition to the abovementioned definition, D50 of the phosphorus-containing copper powder in this embodiment (see the item of the later-described example, for specific examples of how to determine) is 7.11 µm or less. As described above, by adopting the technique of this embodiment, even if the particle size is made small, the oxygen content can be suppressed to be low. Therefore, by defining D50 of the phosphorus-containing copper powder to be as small as 7.11 µm or less in this embodiment, the abovementioned effect can be remarkably exhibited. From a viewpoint of this effect, D50 of the phosphorus-containing copper powder is preferably 0.2 to 5.0 µm, and more preferably 0.3 to 4.0 µm.

Preferred constitutions of the phosphorus-containing copper powder of the present invention other than those mentioned above include the following.

The ratio of the carbon content (wt. %) to the BET specific surface area ($m^2$/g) (carbon content/BET specific surface area) is 0.03 wt. %·g/$m^2$ or less.

The contained amount of phosphorus is from 10 to 1000 ppm.

The value of oxygen content (wt. %)×D50 is 1.40 wt. %·µm or less.

The carbon content/BET specific surface area refers to the content of carbon when compared with the BET specific surface area, that is, the phosphorus-containing copper powder, similarly to the oxygen content/BET specific surface area. When the particle size of the particles constituting the phosphorus-containing copper powder is made small, the surface area per unit mass is naturally increased, and the ratio of the carbon content attached to the particle surface is increased, and therefore the BET specific surface area is placed in the denominator and a value indicating the balance between the specific surface area and the carbon content is used as an indicator. From a viewpoint of good volume resistivity, the carbon content/BET specific surface area is preferably 0.025 wt. %·g/$m^2$ or less, and more preferably 0.020 wt. %·g/$m^2$ or less.

The amount of phosphorus contained in the phosphorus-containing copper powder, is described in 1-2. The phosphorus adding step.

The oxygen content (wt. %)×D50 is a value proportional to [{(oxygen content)×(particle volume×copper density)}/particle surface area]. The fact that this value is 1.40 wt. %·µm or less means that the oxygen content in the phosphorus-containing copper powder is low when compared with the surface area of the phosphorus-containing copper powder. Conventionally, when D50 is set to be small, the oxygen content (wt. %) is usually increased for the reason mentioned above, and the value of oxygen content×D50 is hardly decreased. However, by adopting the technique of this embodiment, increase of the oxygen content can be suppressed even if D50 is set to be small. In view of the results of the later-described examples, the range is 1.40 wt. %·µm or less.

Further, in this embodiment, it is extremely preferable that D50 is less than 1.0 µm. As far as the inventors of the present invention know, there is no phosphorus-containing copper powder satisfying not only a condition that "oxygen content/BET specific surface area value is 0.90 wt. %·g/$m^2$ or less" and "divalent copper compound is present on the surface of the particles constituting the phosphorus-containing copper powder", but also a condition that D50 is less than 1.0 µm (nano meter order). Namely, by adopting the technique of this embodiment, the oxygen content can be suppressed to be low even in a case of the phosphorus-containing copper powder with a particle size made small to a nano meter order, and an extremely good volume resistivity can be expected when the copper powder of this constitution is used as an electric material. Further, accordingly, thinning of electrodes and thinning of film thickness can be achieved.

As a constitution other than the above constitution, the ratio of the divalent copper compound among the copper compounds constituting the surface of the phosphorus-containing copper powder is preferably 10% or more. This shows that a stable passive film as described above is formed.

<3. Effect of this Embodiment>

This embodiment exhibits the following effects.

In this embodiment, after the alkaline aqueous solution is adopted as the spray water, the water atomizing method is adopted to prepare the phosphorus-containing copper powder. Thus, the lowering of pH of the slurry can be suppressed during the production step and the oxidation of the particles can be suppressed even when the particle size is made small. As a result, the oxidation resistance of the phosphorus-containing copper powder can be improved even when the particle size is made small. As a result, even if the particle size is made small, by controlling the oxygen content to be relatively low, the phosphorus-containing copper powder with good volume resistivity can be obtained. Further, there is no need to add the organic acid to the spray water in order to reduce the oxygen content, and therefore the carbon content in the obtained phosphorus-containing copper powder can also be decreased. As a result, the phosphorus-containing copper powder with good volume resistivity can be obtained.

EXAMPLES

Next, the present invention will be described in detail by showing examples. Of course, the present invention is not limited to the following examples.

Example 1

In this example, the phosphorus-containing copper powder was produced using the method for producing the phosphorus-containing copper powder described in the abovementioned embodiment. Each condition will be described hereafter, but the content without special mention is as described in table 1 below.
(Copper Raw Material Melting Step)

In this step, 15 kg of oxygen-free copper balls were melted, to thereby prepare a molten metal. The temperature of the molten metal was set to 1300° C.
(Phosphorus Adding Step)

In this step, a phosphorus copper ingotmetal (phosphorus content was 15 wt. %) was used and added to the molten metal so that the phosphorus content in the molten metal was 400 ppm.
(pH Adjustment Step of Adjusting pH of the Spray Water)

In this step, the spray water used in the water atomization step was prepared. Specifically, the alkaline aqueous solution prepared by adding 25.1 g of caustic soda to 15.8 m$^3$ of pure water was provided as the spray water. pH value of the spray water was 9.6 (numerical value at 15° C.).
(Water Atomization Step)

In this step, water atomization was performed. Each condition (water pressure etc.) is as follows.
Water pressure: 100 MPa
Water flow volume: 160 L/min.
(Drying and Others)

In this step, the slurry obtained in the water atomization step was dried and crushed after solid-liquid separation, to thereby obtain a fine powder by air classifire.

Then, various evaluations were performed to the obtained phosphorus-containing copper powder. The results are shown in table 1 below.

Various evaluations were performed using the following apparatus or technique.

D50 (μm) . . . A laser diffraction type particle size distribution measuring apparatus (HELOS & RODOS (dry dispersion in the free aerosol jet) manufactured by SYMPATEC Co., Ltd.) was used, to thereby obtain a cumulative 50% particle size based on volume under a dispersion pressure of 5 Bar.

Oxygen content (wt. %) in phosphorus-containing copper powder . . . was measured by O/N meter (EMGA-920, manufactured by Horiba ltd.)

Whether the divalent copper compound is present on the surface of the particles constituting the phosphorus-containing copper powder . . . was determined by an X-ray photoelectron spectroscope (ESCA 5800, manufactured by ULVAC-PHI) (hereinafter referred to simply as ESCA)
(Measurement Condition)
X-ray source . . . Al monochromatic X-ray source
Output . . . 150 W
Photoelectron take-off angle . . . 45°
Pass energy . . . 23.5 eV Content of phosphorus . . . it was measured by ICP emission spectrophotometer (SPS 3520 V, manufactured by Hitachi High-Tech Science corporation)

BET specific surface area (m$^2$/g) . . . By using BET specific surface area measuring device (manufactured by Yuasa Ionics ltd., 4 Sorb US), degassing was performed at 105° C. for 20 minutes while flowing N$_2$, and it was measured by the BET one-point method while flowing a mixed gas of N$_2$—He (30 vol % of N$_2$, 70 vol % of He).

Carbon content (wt. %) in the phosphorus-containing copper powder . . . It was measured by a carbon/sulfur analyzer (EMIA-220V manufactured by Horiba ltd.).

Example 2

The fine powder was prepared in the same manner as in example 1 except that the addition amount of caustic soda was set to 126.1 g. Then, various evaluations similar to those in example I were performed.

Example 3

The fine powder was prepared in the same manner as in example 1 except that the molten metal temperature was set to 1600° C. and the phosphorus copper metal was added so that the phosphorus content in the molten metal was 950 ppm, and the addition amount of caustic soda was set to 316.7 g, and the water pressure was set to 150 Mpa. Then, various evaluations similar to those in example 1 were performed.

Example 4

The fine powder was prepared in the same manner as in example 3 except that phosphorous copper metal was added so that the phosphorus content in the molten metal was 1400 ppm, and the addition amount of caustic soda was set to 126.1 g. Then, various evaluations similar to those in example 1 were performed.

Example 5

The fine powder was prepared in the same manner as in example 1 except that the phosphorous copper metal was added so that the phosphorus content in the molten metal was 790 ppm, the addition amount of caustic soda was set to 100.3 g, and the water pressure was set to 65 MPa. Then, various evaluations similar to those in example 1 were performed.

Example 6

The fine powder was prepared in the same manner as in example 3 except that the phosphorous copper metal was added so that the phosphorus content in the molten metal was 1800 ppm. Then, various evaluations similar to those in example 1 were performed.

Example 7

The fine powder was prepared in the same manner as in example 2 except that the phosphorous copper metal was added so that the phosphorus content in the molten metal was 300 ppm, and the water pressure was set to 150 MPa. Then, various evaluations similar to those in example 1 were performed.

Example 8

The fine powder was prepared in the same manner as in example 5 except that the addition amount of caustic soda was set to 631.5 g and the water pressure was set to 150 MPa. Then, various evaluations similar to those in example 1 were performed.

Comparative Example 1

In this comparative example, the fine powder was prepared in the same manner as in comparative example 1 except that the temperature of the molten metal was set to 1200° C., phosphorus was not added to the molten metal, pure water was used as the spray water, and water atomization was performed under conditions of a water pressure of 150 MPa and a water amount of 160 L/min. Then, various evaluations similar to those in example 1 were performed.

Comparative Example 2

In this comparative example, the fine powder was prepared in the same manner as in comparative example 1 except that the temperature of the molten metal was set to 1300° C. and the phosphorus copper metal was added so that the phosphorus content in the molten metal was 300 ppm. Then, various evaluations similar to those in example 1 were performed.

Comparative Example 3

In this comparative example, the fine powder was prepared in the same manner as in comparative example 1 except that the temperature of the molten metal was set to 1300° C., and the addition amount of caustic soda was changed to 126.1 g. Then, various evaluations similar to those in example 1 were performed.

Comparative Example 4

In this comparative example, the fine powder was prepared in the same manner as in comparative example 1 except that the water pressure was set to 100 MPa. Then, various evaluations similar to those in example 1 were performed.

<Result>

The following table 1 shows the results of the abovementioned examples and comparative examples.

TABLE 1

| | Manufacture condition | | | | | Results of various evaluations | | | | | | | | |
|---|---|---|---|---|---|---|---|---|---|---|---|---|---|---|
| | P addition amount (ppm) | Temperature of molten metal (° C.) | Addition amount of caustic soda (g) | Spray water pH | Water pressure (MPa) | D50 (μm) | BET ($m^2/g$) | Oxygen content (wt %) | Carbon content (wt %) | P content (ppm) | O/BET (wt % · $g/m^2$) | O × D50 (wt % · μm) | C/BET (wt % · $g/m^2$) | Divalent copper compound |
| Example 1 | 400 | 1300 | 25.1 | 9.6 | 100 | 3.48 | 0.44 | 0.30 | 0.01 | 220 | 0.68 | 1.04 | 0.023 | Present |
| Example 2 | 400 | 1300 | 126.1 | 10.3 | 100 | 2.07 | 0.57 | 0.26 | 0.01 | 280 | 0.46 | 0.54 | 0.018 | Present |
| Example 3 | 950 | 1600 | 316.7 | 10.7 | 150 | 0.59 | 2.09 | 0.89 | 0.04 | 405 | 0.43 | 0.53 | 0.019 | Present |
| Example 4 | 1400 | 1600 | 126.1 | 10.3 | 150 | 0.97 | 1.13 | 0.51 | 0.01 | 590 | 0.45 | 0.49 | 0.009 | Present |
| Example 5 | 790 | 1300 | 100.3 | 10.2 | 65 | 7.11 | 0.15 | 0.07 | 0.00 | 500 | 0.47 | 0.50 | 0.000 | Present |
| Example 6 | 1800 | 1600 | 316.7 | 10.7 | 150 | 0.85 | 1.48 | 0.94 | 0.02 | 700 | 0.64 | 0.80 | 0.014 | Present |
| Example 7 | 300 | 1300 | 126.1 | 10.3 | 150 | 2.06 | 0.60 | 0.25 | 0.01 | 110 | 0.42 | 0.52 | 0.017 | Present |
| Example 8 | 790 | 1300 | 631.5 | 11.0 | 150 | 2.07 | 0.55 | 0.27 | 0.01 | 305 | 0.49 | 0.56 | 0.018 | Present |
| Comparative example 1 | None | 1200 | 0.0 | 5.8 | 150 | 2.30 | 0.66 | 0.69 | 0.01 | <10 | 1.05 | 1.59 | 0.015 | Absent |
| Comparative example 2 | 300 | 1300 | 0.0 | 5.8 | 150 | 1.93 | 0.88 | 1.17 | 0.01 | 210 | 1.33 | 2.26 | 0.011 | Absent |
| Comparative example 3 | None | 1300 | 126.1 | 10.3 | 100 | 3.21 | 0.46 | 0.46 | 0.01 | <10 | 1.00 | 1.48 | 0.022 | Absent |
| Comparative example 4 | None | 1200 | 0.0 | 5.8 | 100 | 3.27 | 0.52 | 0.51 | 0.01 | <10 | 0.98 | 1.67 | 0.019 | Absent |

As seen from table 1, each example satisfies the following conditions:

Oxygen content (wt. %)/BET specific surface area value is 0.90 wt. %·$g/m^2$ or less.

Carbon content (wt. %) is 0.10 wt. % or less.

Carbon content (wt. %)/BET specific surface area value is 0.03 wt. %·$g/m^2$ or less.

The value of oxygen content (wt. %)×D50 is 1.40 wt. %·μm or less.

Divalent copper compound is present on the surface of the particles constituting the phosphorus-containing copper powder.

D50 is 7.11 μm or less. On the other hand, there is no comparative example that satisfies all of the above conditions.

Figure 2:
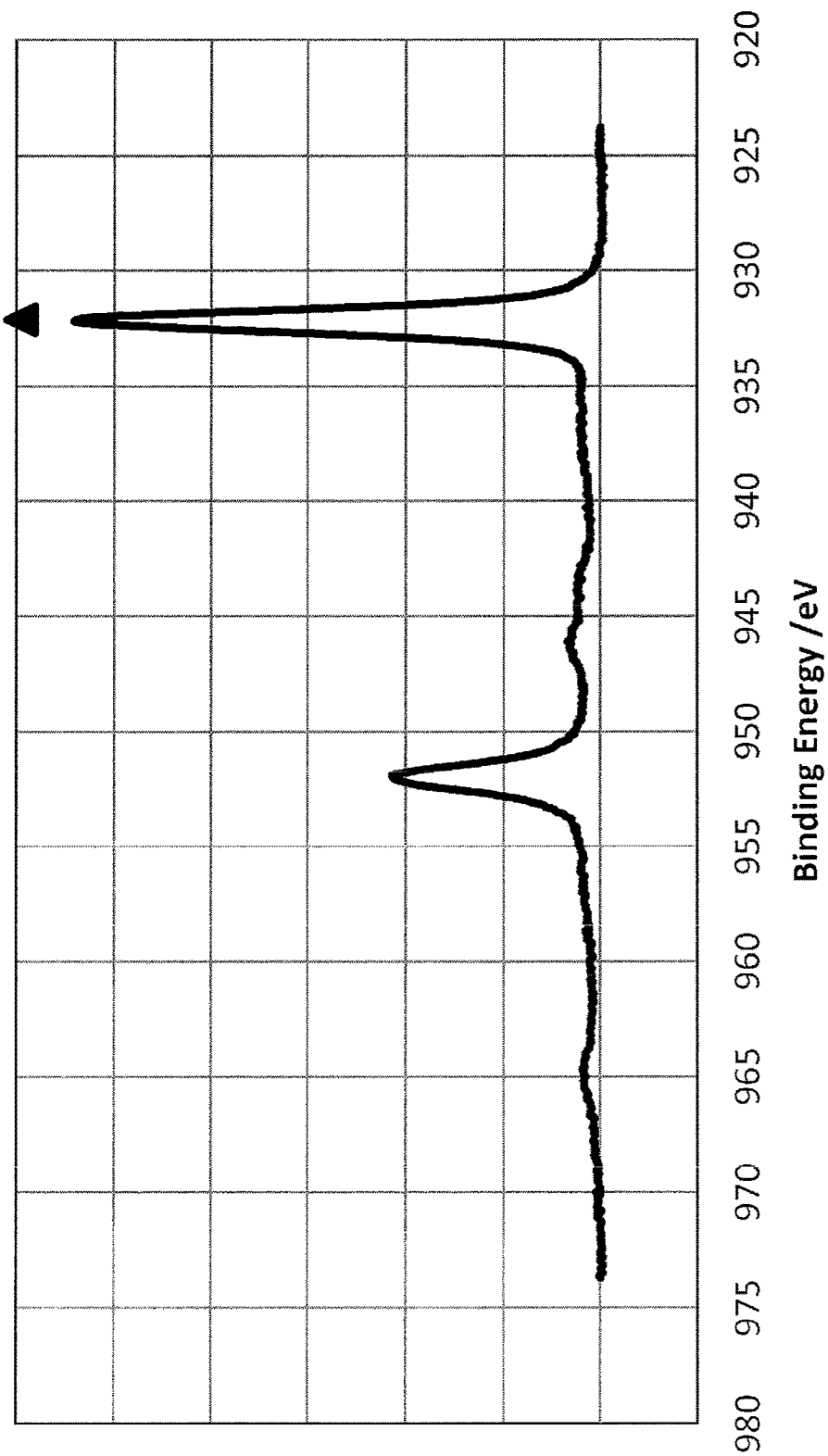
FIG. 2 is a chart showing a result of the state analysis of copper obtained by measuring a sample of comparative example 1 by ESCA.

Whether or not the divalent copper compound was present on the surface of the particles constituting the phosphorus-containing copper powder, was examined by ESCA. Specific results obtained at that time are shown in FIG. 1 and FIG. 2. FIG. 1 is a chart showing a result of state analysis of copper obtained by measuring a sample of example 2, using ESCA. FIG. 2 is a chart showing the result of state analysis of copper obtained by measuring a sample of comparative example 1, using ESCA.

There is a satellite peak indicating the presence of the divalent copper compound in example 2 as shown in FIG. 1, and meanwhile there is no peak showing the presence of the divalent copper compound in comparative example 1 as shown in FIG. 2.

As a result of the above, this example shows the phosphorus-containing copper powder in which the oxygen content is suppressed to be relatively low even when the particle size is made small, as compared with this comparative example. Therefore, when the phosphorus-containing copper powder of this example is used as an electric material, good volume resistivity and adhesion can be expected.

The invention claimed is:

1. A phosphorus-containing copper powder containing phosphorus, wherein:
   a ratio of an oxygen content (wt. %) to a BET specific surface area (m$^2$/g) (oxygen content/BET specific surface area) is 0.90 wt. %·g/m$^2$ or less,
   a divalent copper compound is present on a surface of particles constituting the phosphorus-containing copper powder,
   a carbon content is 0.10 wt. % or less,
   D50 is 7.11 μm or less, and
   an amount of phosphorus contained in the phosphorus-containing copper powder is 305 to 405 ppm.

2. The phosphorus-containing copper powder according to claim 1, wherein a value of oxygen in the phosphorus-containing copper powder×D50 is 1.40 wt. %·um or less.

3. The phosphorus-containing copper powder according to claim 1, wherein D50 is less than 1.0 μm.

4. The phosphorus-containing copper powder according to claim 1, wherein a ratio of carbon content (wt. %) to the BET specific surface area (m$^2$/g) of the phosphorus-containing copper powder (carbon content/BET specific surface area) is 0.03 wt. %·g/m$^2$ or less.

5. The phosphorus-containing copper powder according to claim 1, wherein:
   a value of oxygen in the phosphorus-containing copper powder×D50 is 1.40 wt. %·um or less, and
   D50 is less than 1.0 μm.

6. The phosphorus-containing copper powder according to claim 1, wherein:
   a value of oxygen in the phosphorus-containing copper powder×D50 is 1.40 wt. %·um or less, and
   a ratio of carbon content (wt. %) to the BET specific surface area (m$^2$/g) of the phosphorus-containing copper powder (carbon content/BET specific surface area) is 0.03 wt. % ·g/m$^2$ or less.

7. The phosphorus-containing copper powder according to claim 1, wherein:
   D50 is less than 1.0 μm, and
   a ratio of carbon content (wt. %) to the BET specific surface area (m$^2$/g) of the phosphorus-containing copper powder (carbon content/BET specific surface area) is 0.03 wt. % ·g/m$^2$ or less.

8. The phosphorus-containing copper powder according to claim 1, wherein:
   a value of oxygen in the phosphorus-containing copper powder×D50 is 1.40 wt. %·um or less,
   D50 is less than 1.0 μm, and
   a ratio of carbon content (wt. %) to the BET specific surface area (m$^2$/g) of the phosphorus-containing copper powder (carbon content/BET specific surface area) is 0.03 wt. % ·g/m$^2$ or less.

9. A phosphorus-containing copper powder containing phosphorus, wherein
   a ratio of an oxygen content (wt. %) to a BET specific surface area (m$^2$/g) (oxygen content/BET specific surface area) is 0.90 wt. %·g/m$^2$ or less,
   a divalent copper compound is present on a surface of particles constituting the phosphorus-containing copper powder,
   a carbon content is 0.10 wt. % or less,
   D50 is 7.11 μm or less, and
   an amount of phosphorus contained in the phosphorus-containing copper powder is 380 to 550 ppm.

10. The phosphorus-containing copper powder according to claim 9, wherein a value of oxygen in the phosphorus-containing copper powder×D50 is 1.40 wt. %·um or less.

11. The phosphorus-containing copper powder according to claim 9, wherein D50 is less than 1.0 μm.

12. The phosphorus-containing copper powder according to claim 9, wherein a ratio of carbon content (wt. %) to the BET specific surface area (m$^2$/g) of the phosphorus-containing copper powder (carbon content/BET specific surface area) is 0.03 wt. %·g/m$^2$ or less.

13. The phosphorus-containing copper powder according to claim 9, wherein:
   a value of oxygen in the phosphorus-containing copper powder×D50 is 1.40 wt. %·um or less, and
   D50 is less than 1.0 μm.

14. The phosphorus-containing copper powder according to claim 9, wherein:
   a value of oxygen in the phosphorus-containing copper powder×D50 is 1.40 wt. %·um or less, and
   a ratio of carbon content (wt. %) to the BET specific surface area (m$^2$/g) of the phosphorus-containing copper powder (carbon content/BET specific surface area) is 0.03 wt. % ·g/m$^2$ or less.

15. The phosphorus-containing copper powder according to claim 9, wherein:
   D50 is less than 1.0 μm, and
   a ratio of carbon content (wt. %) to the BET specific surface area (m$^2$/g) of the phosphorus-containing copper powder (carbon content/BET specific surface area) is 0.03 wt. % ·g/m$^2$ or less.

16. The phosphorus-containing copper powder according to claim 9, wherein:
   a value of oxygen in the phosphorus-containing copper powder×D50 is 1.40 wt. %·um or less,
   D50 is less than 1.0 μm, and
   a ratio of carbon content (wt. %) to the BET specific surface area (m$^2$/g) of the phosphorus-containing copper powder (carbon content/BET specific surface area) is 0.03 wt. % ·g/m$^2$ or less.

17. A method for producing a phosphorus-containing copper powder from a molten metal in which phosphorus has been added to melted copper by a water atomizing method, wherein:
   an amount of the phosphorus added to the melted copper is 850 to 1600 ppm in the molten metal, and
   a spray water used in the water atomization method is an alkaline aqueous solution.

* * * * *